(12) United States Patent
Liu

(10) Patent No.: US 7,466,172 B2
(45) Date of Patent: Dec. 16, 2008

(54) SUPPLY VOLTAGE LEVEL DETECTOR

(75) Inventor: Chih-Min Liu, Taipei (TW)

(73) Assignee: Via Technologies, Inc., Taipei (TW)

( * ) Notice: Subject to any disclaimer, the term of this patent is extended or adjusted under 35 U.S.C. 154(b) by 58 days.

(21) Appl. No.: 11/758,723

(22) Filed: Jun. 6, 2007

(65) Prior Publication Data

US 2008/0054996 A1    Mar. 6, 2008

Related U.S. Application Data

(60) Provisional application No. 60/824,290, filed on Sep. 1, 2006.

(30) Foreign Application Priority Data

Dec. 29, 2006    (TW) ............................... 95149874 A

(51) Int. Cl.
*H03L 7/00*    (2006.01)
(52) U.S. Cl. ........................... 327/143; 327/77; 327/81; 327/88
(58) Field of Classification Search ........................ None
See application file for complete search history.

(56) References Cited

U.S. PATENT DOCUMENTS

| | | | | |
|---|---|---|---|---|
| 5,867,047 A | * | 2/1999 | Kraus ......................... 327/143 |
| 6,750,683 B2 | * | 6/2004 | McClure et al. ................ 327/78 |
| 6,803,751 B2 | * | 10/2004 | Messager ..................... 323/273 |
| 7,242,565 B2 | * | 7/2007 | Yoshio ........................ 361/103 |
| 2002/0158673 A1 | * | 10/2002 | McClure et al. ................ 327/78 |
| 2003/0076077 A1 | * | 4/2003 | Messager ..................... 323/281 |
| 2006/0104001 A1 | * | 5/2006 | Yoshio ........................ 361/103 |
| 2008/0143395 A1 | * | 6/2008 | Frulio et al. ................. 327/143 |

* cited by examiner

*Primary Examiner*—Tuan T Lam
*Assistant Examiner*—Hiep Nguyen
(74) *Attorney, Agent, or Firm*—Thomas, Kayden, Horstemeyer & Risley

(57) ABSTRACT

Supply voltage level detectors are disclosed. The supply voltage level detector comprises a voltage source divider dividing a voltage source to generate a detection voltage, a bandgap reference voltage generator, a comparator comparing the detection voltage with a bandgap reference voltage generated by the bandgap reference voltage generator to determine if the voltage source is ready, a control circuit, and a forcing circuit. To ensure reliability of the comparison result, the control circuit disables the comparing device until the bandgap reference voltage is available. The forcing circuit is coupled to the output terminal of the comparing device and is controlled by the control circuit. When the comparing device is disabled, the forcing circuit forces the voltage level of the output terminal of the comparing device to a specific value indicating the voltage source is unready.

10 Claims, 10 Drawing Sheets

SUPPLY VOLTAGE LEVEL DETECTOR

CROSS REFERENCE TO RELATED APPLICATIONS

This application claims the benefit of U.S. Provisional Application No. 60/824,290, filed on Sep. 1, 2006, which is incorporated herein by reference.

BACKGROUND OF THE INVENTION

1. Field of the Invention

The invention relates to supply voltage level detectors.

2. Description of the Related Art

FIG. 1 shows a conventional supply voltage level detector 100, for detecting the voltage level of a voltage source of a chip ($V_{DD}$). The supply voltage level detector 100 comprises a bandgap reference voltage generator 102, a voltage source divider 104, and a comparator CMP. The bandgap reference voltage generator 102, is a basic chip component, and generates a bandgap reference voltage $V_{BG}$. The bandgap reference voltage $V_{BG}$ has a constant value (generally about 1.25 volts) at all temperatures and for all voltage sources. The voltage source divider 104 comprises three transistors, $M_1$, $M_2$, and $M_3$, and two resistors $R_1$ and $R_2$. After the bandgap reference voltage $V_{BG}$ is generated, the transistor $M_1$ is turned on, the transistor $M_2$ operates in a saturation region, the transistor $M_3$ is turned on to generate a current through the resistors $R_1$ and $R_2$, and the voltage source divider 104 divides the voltage source $V_{DD}$ to generate a detection voltage $V_{det}$. In the conventional supply voltage level detector 100, the area of the transistor $M_3$ is greater than the transistor $M_2$, thus, the transistor $M_3$ is operated in a linear region and acts as a resistor. The on resistance of the transistor $M_3$ is $R_{on}$. The detection voltage $V_{det}$ is generated by dividing the voltage source $V_{DD}$ by the on resistance $R_{on}$, and the resistors $R_1$ and $R_2$, wherein $V_{det}=V_{DD} \cdot R_2/(R_{on}+R_1+R_2)$. The comparator CMP compares the detection voltage $V_{det}$ with the bandgap reference voltage $V_{BG}$ and generates a flag signal (Flag) indicating the comparison result. The chip determines if the voltage source $V_{DD}$ is available based on the flag signal (Flag).

The conventional supply voltage level detector 100 does not always function properly. When the voltage source of the chip is reset, the bandgap reference voltage generator 102 does not generate the bandgap reference voltage $V_{BG}$ until the voltage source $V_{DD}$ returns to a specific voltage level. The comparator CMP outputs an unreliable flag signal when the bandgap reference voltage $V_{BG}$ is not ready.

In some cases, the normal value of the voltage source $V_{DD}$ is 5 volts, and the specific voltage level is 2.5 volts. When the voltage source is reset, the bandgap reference voltage generator 102 does not output the bandgap reference voltage $V_{BG}$ until the supply voltage $V_{DD}$ returns to a level greater than the specific voltage level (2.5 volts). It can be seen that comparator CMP only outputs a reliable flag signal after the supply voltage $V_{DD}$ returns to the specific voltage level. Thus, a novel supply voltage level detector capable of reliable flag signal (Flag) output is desirable.

BRIEF SUMMARY OF THE INVENTION

The invention provides a highly reliable supply voltage level detector. The supply voltage level detector of the invention only operates when the bandgap reference signal is ready.

An embodiment of the invention comprises a voltage source divider, a bandgap reference voltage generator, a comparing device, a control circuit, and a forcing circuit. The voltage source divider divides the voltage level of a voltage source to generate a detection voltage. The comparing device compares the detection voltage with a bandgap reference voltage generated by the bandgap reference voltage generator to determine if the voltage source is ready. When the voltage source is reset, the bandgap reference voltage generator does not generate the bandgap reference voltage until the voltage source returns to a level greater than a specific voltage level. To ensure the reliability of the supply voltage level detector, the control circuit disables the comparing device before the bandgap reference voltage is available. When the bandgap reference voltage is available, the control circuit enables the comparing device. The forcing circuit is coupled to the output terminal of the comparing device, and controlled by the control circuit. When the comparing device is disabled, the forcing circuit forces the voltage level of the output terminal of the comparing device to a specific value to prevent output of an unreliable flag signal of the comparing device.

The above and other advantages will become more apparent with reference to the following description taken in conjunction with the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
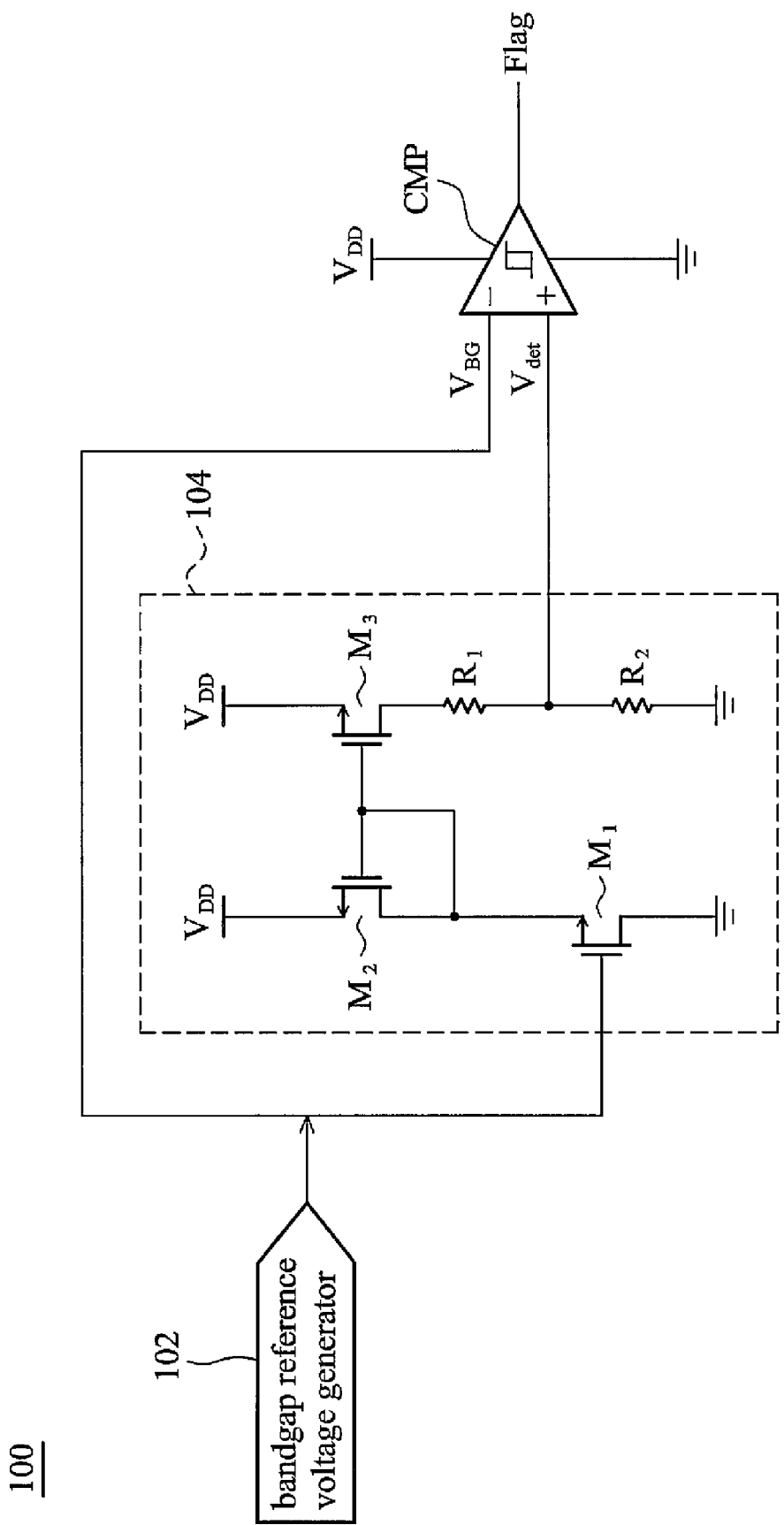
FIG. 1 shows a conventional supply voltage level detector.
Figure 2:
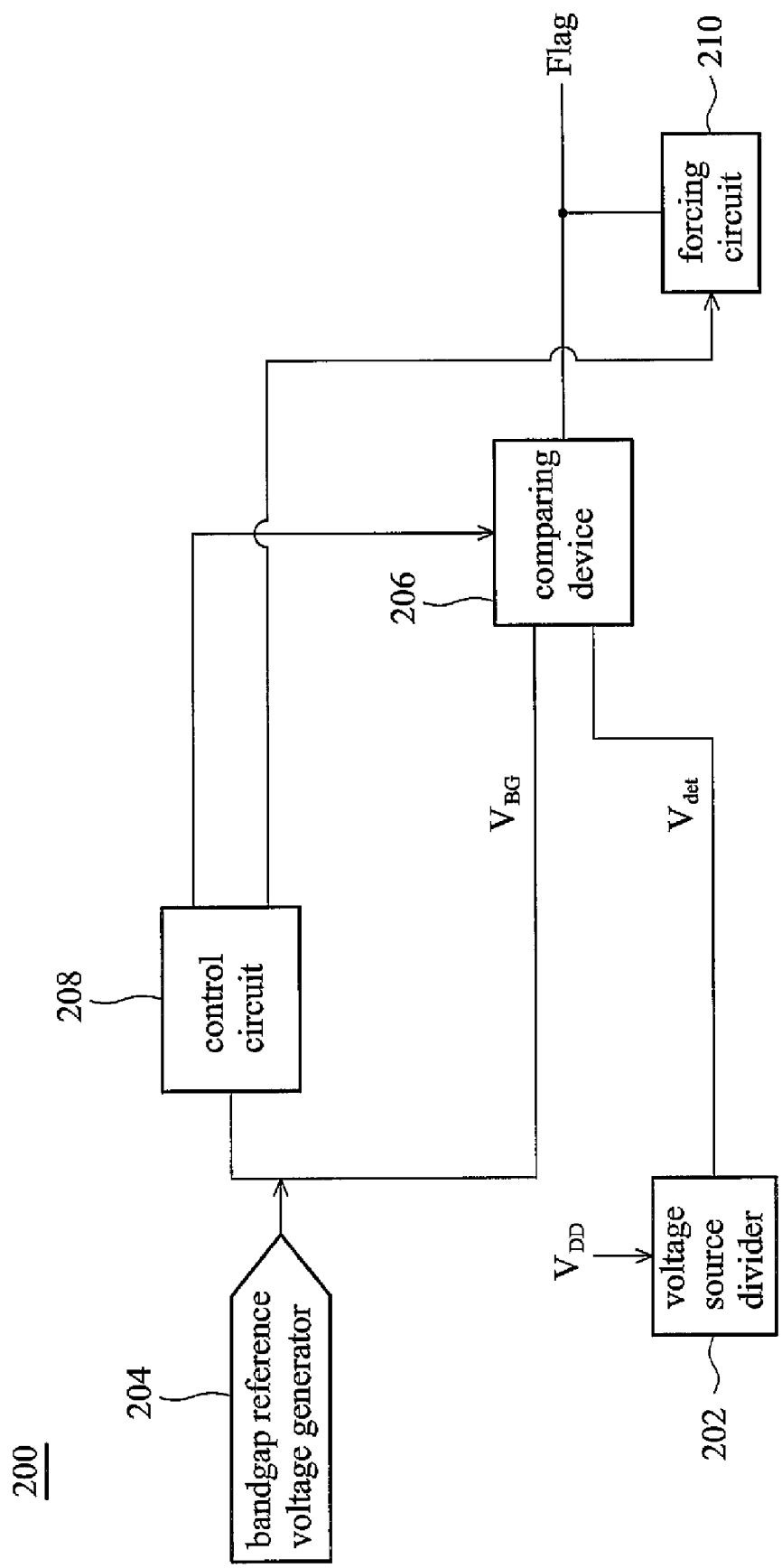
FIG. 2 shows an embodiment of the invention.

FIG. 2 shows an embodiment of the invention. A supply voltage level detector 200 comprises a voltage source divider 202, a bandgap reference voltage generator 204, a comparing device 206, a control circuit 208, and a forcing circuit 210. The voltage source divider 202 divides the voltage source $V_{DD}$ to generate a detection voltage $V_{det}$, proportional to the voltage source $V_{DD}$. The comparing device 206 compares the detection voltage $V_{det}$ with a constant bandgap reference voltage $V_{BG}$ output from the bandgap reference voltage generator 204 to determine if the voltage source $V_{DD}$ is ready. When the voltage source $V_{DD}$ is reset, however, the bandgap reference voltage generator 204 does not generate the bandgap reference voltage $V_{BG}$ until the supply voltage $V_{DD}$ returns to a level greater than a specific voltage level. The control circuit 208 disables the comparing device 206 when the bandgap reference voltage $V_{BG}$ is not available to ensure the reliability of the output of the comparing device 206. When the bandgap reference voltage $V_{BG}$ is available, the control circuit 208 switches from disabling the comparing device 206 to enable the comparing device 206. The forcing circuit 210 is coupled to the output terminal of the comparing device 206 and is controlled by the control circuit 208. When the comparing device 206 is disabled, the forcing circuit 210 forces the voltage level of the output terminal thereof preventing output of an erroneous flag signal (Flag).

Figure 3:
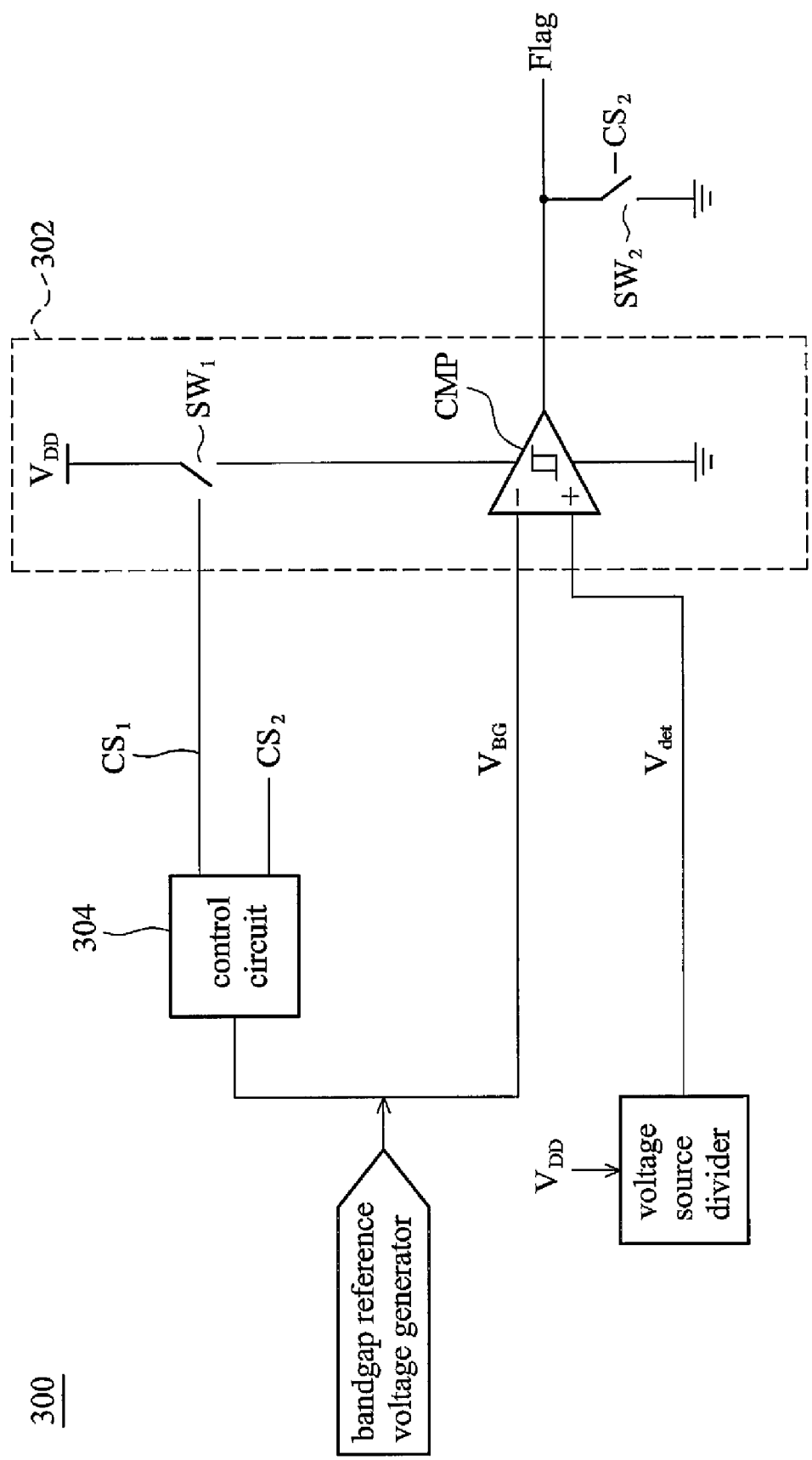
FIG. 3 shows an alternative embodiment of the invention.

FIG. 3 shows an alternative embodiment of the invention. A supply voltage level detector 300 has a comparing device 302 comprising a comparator CMP and a first switch $SW_1$. The bandgap reference voltage $V_{BG}$ and the detection voltage $V_{det}$ are coupled to an inverting input terminal and a non-inverting input terminal of the comparator CMP, respectively. The first switch $SW_1$, coupled between a power terminal of the comparator CMP and the voltage source $V_{DD}$, is controlled by a first control signal $CS_1$ generated by the control circuit 304. To disable the comparator CMP, the control circuit 304 disconnects the first switch $SW_1$ by the first control signal $CS_1$. To enable the comparator CMP, the control circuit 304 turns on the first switch $SW_1$ by the first control signal $CS_1$.

The supply voltage level detector 300 implements the forcing circuit 210 by a second switch $SW_2$. The second switch $SW_2$ is controlled by a second control signal $CS_2$ generated by the control circuit 304. When the comparator CMP is disabled, the second switch SW2 couples the output terminal of the comparator CMP to ground to prevent output of an unreliable flag signal (Flag), such as erroneously indicating that a voltage $V_{det}$ is higher than an unready bandgap reference voltage $V_{BG}$.

Figure 4:
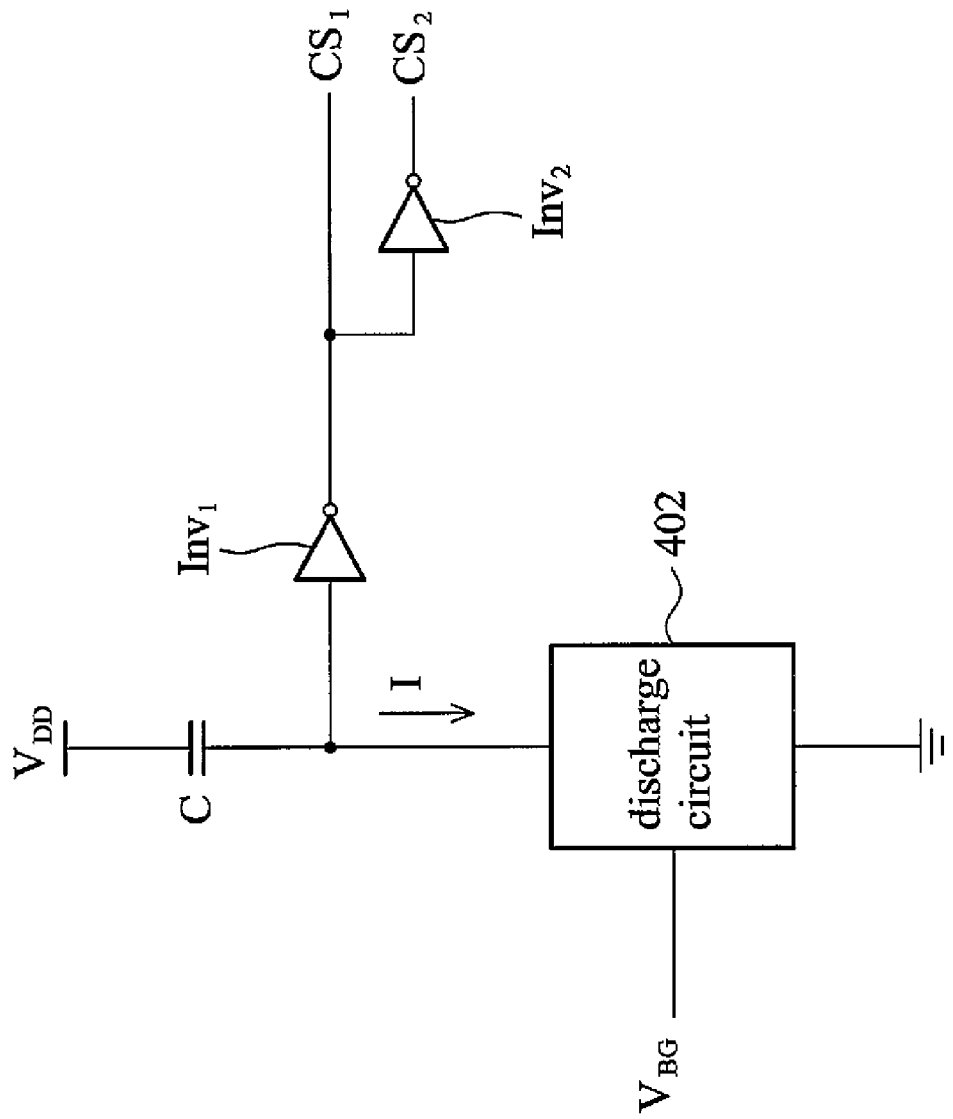
FIG. 4 shows an embodiment of the control circuit of the invention.

FIG. 4 shows an embodiment of the control circuit 304, comprising a capacitor C, a discharge circuit 402, a first inverter $Inv_1$, and a second inverter $Inv_2$. The first and second terminal of the capacitor C are coupled to the voltage source $V_{DD}$ and the discharge circuit 402, respectively. When the bandgap reference voltage $V_{BG}$ is generated, the discharge circuit 402 is turned on to generate a discharge current I to discharge the capacitor C. The first inverter $Inv_1$ has an input terminal coupling to the second terminal of the capacitor C and an output terminal outing the first control signal $CS_1$. In some cases, when the first control signal $CS_1$ is high, the first switch $SW_1$ is turned on to enable the comparator CMP. Conversely, when the first control signal $CS_1$ is low, the first switch $SW_1$ is turned off, and the comparator CMP is disabled. The input terminal of the second inverter $Inv_2$ is coupled to the output terminal of the first inverter $Inv_1$ to invert the first control signal $CS_1$ to generate the second control signal $CS_2$. When the second control signal $CS_2$ is high, the second switch $SW_2$ is turned on; otherwise the second switch $SW_2$ is turned off.

Figure 5:
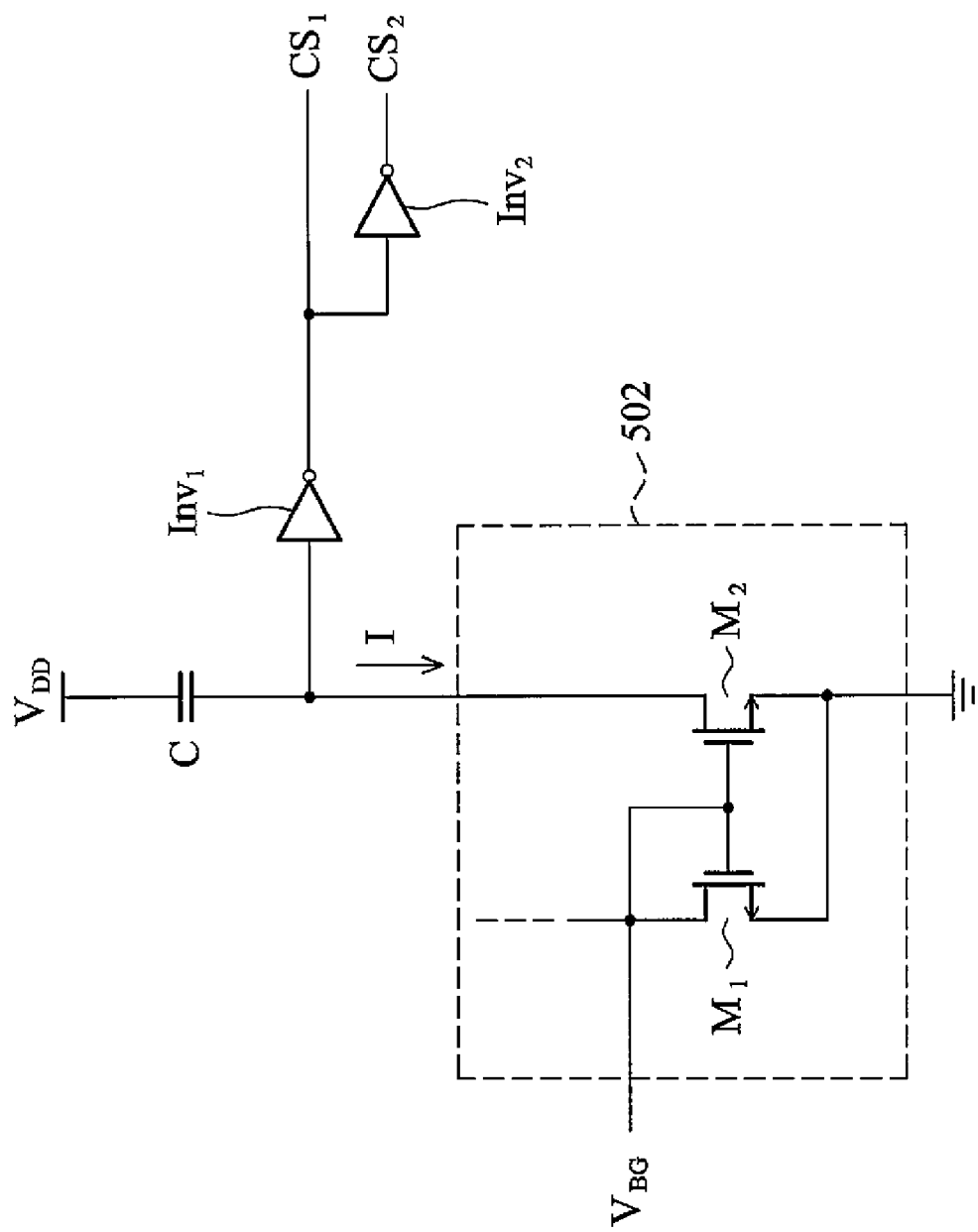
FIG. 5 shows another embodiment of the control circuit of the invention.

The discharge current I decreases as the voltage level of the second terminal of capacitor C decreases. FIG. 5 shows an embodiment of the control circuit 304, comprising a discharge circuit 502 implemented by a current mirror comprising a first transistor $M_1$ and a second transistor $M_2$. The gate and drain of the first transistor $M_1$ are connected. The gates of the first and second transistors $M_1$ and $M_2$ are coupled to and controlled by the bandgap reference voltage $V_{BG}$. The voltage difference between the gate and source of the first transistor $M_1$ is the same as that of the second transistor $M_2$. The drain of the second transistor $M_2$ is coupled to the second terminal of the capacitor C.

When the voltage source $V_{DD}$ had been reset but has not yet returned to a specific voltage level, the bandgap reference voltage $V_{BG}$ is not available. The discharge circuit 502 is thus still disabled, and the discharge current I is zero. The voltage level of the second terminal of the capacitor C increases as the voltage level of the voltage source VDD increases. With the increasing voltage level of the second terminal of the capacitor C, the first control signal $CS_1$ output from the first inverter $Inv_1$ is low, and the second control signal $CS_2$ output from the second inverter $Inv_2$ is high. Referring to FIG. 3, the first control signal $CS_1$ disconnects the first switch $SW_1$ to disable the comparator CMP, and the second control signal $CS_2$ forces the output terminal (Flag) of the comparator CMP coupling to the ground to prevent the comparator CMP from erroneous judgments.

Figure 6:
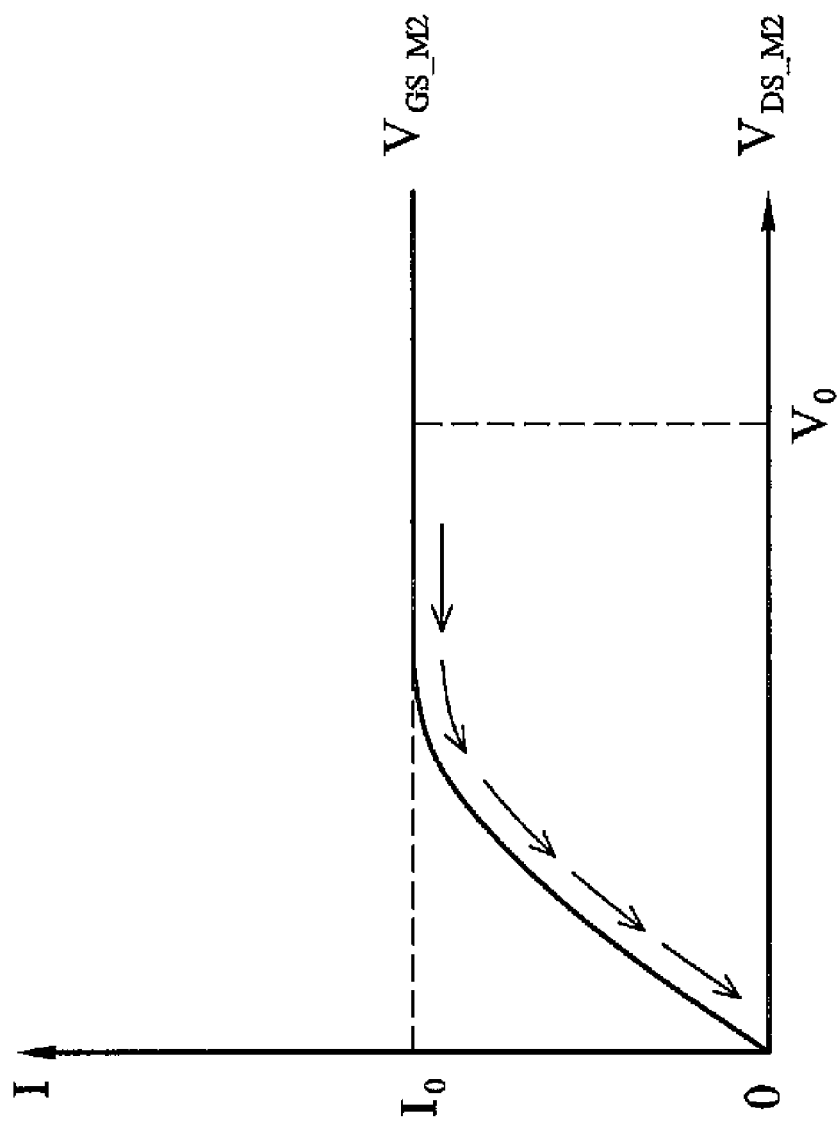
FIG. 6 shows the relationship between the discharge current I and $V_{DS\_M2}$, which is the voltage difference between drain and source of the second transistor $M_2$.

Referring to FIG. 5, after the voltage source $V_{DD}$ regains to the specific voltage level, the bandgap reference voltage $V_{BG}$ is generated, and the discharge circuit 502 is turned on to generate a discharge current I to discharge the capacitor C. FIG. 6 shows the relationship between the discharge current I and $V_{DS\_M2}$, the voltage difference between drain and source of the second transistor $M_2$. As shown in FIG. 6, in the beginning the discharge current I is generated, the voltage level of the second terminal of the capacitor C (equivalent to $V_{DS\_M2}$) is $V_0$, and the value of the discharge current I is $I_0$. The voltage level of the second terminal of the capacitor C ($V_{DS\_M2}$) decreases while discharging, and the discharge current I decreases as $V_{DS\_M2}$ decrease, as shown by the arrows in FIG. 6. At the end of the discharge process, the value of the discharge current I and $V_{DS\_M2}$ is zero. The zero $V_{DS\_M2}$ represents that the voltage level of the second terminal of the capacitor C is zero. Thus, the first control signal $CS_1$ output from the first inverter $Inv_1$ is high, and the second control signal $CS_2$ output from the second inverter $Inv_2$ is low. The first switch $SW_1$ is turned on by the first control signal $CS_1$ to enable the comparator CMP. The second switch $SW_2$ is disconnected by the second control signal $CS_2$, and the comparator CMP operates normally.

Figure 7:
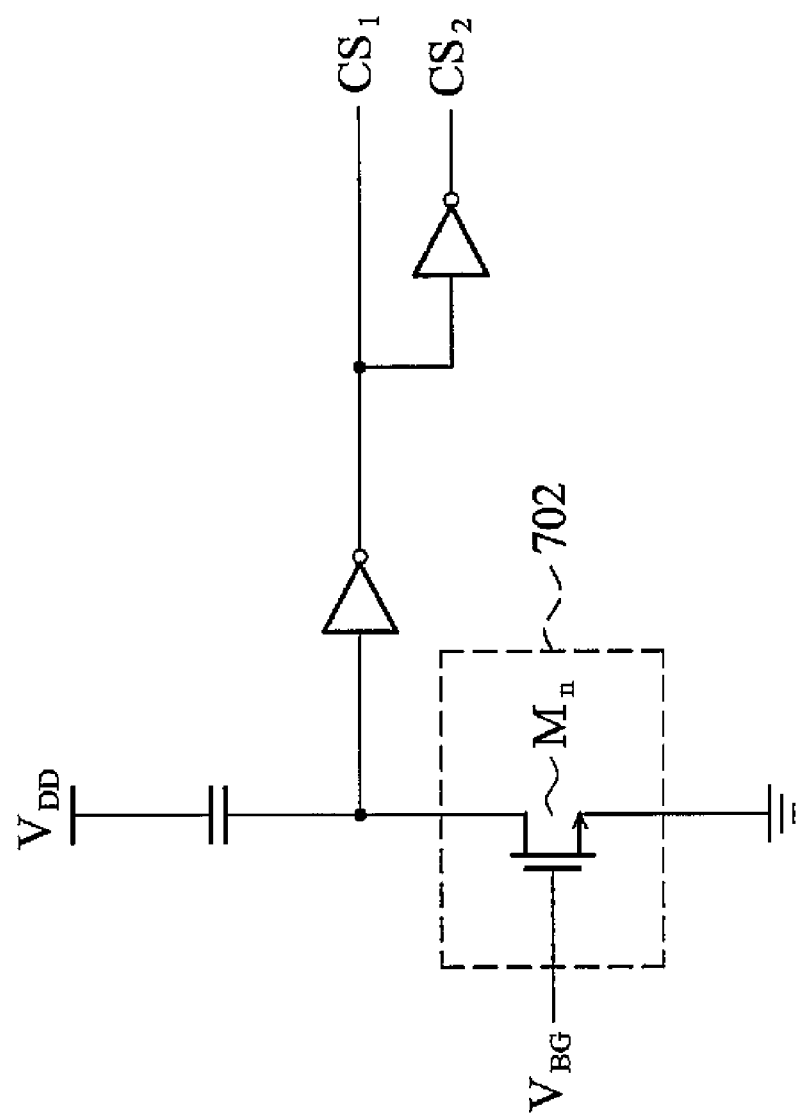
FIG. 7 shows an alternative embodiment of the control circuit of the invention.

FIG. 7 shows an alternative embodiment of the control circuit 304, comprising a discharge circuit 702 implemented by an n-type metal oxide semiconductor (NMOS) $M_n$ having a gate coupled to the bandgap reference voltage $V_{BG}$, a drain coupled to the second terminal of the capacitor C, and a source coupled to ground. According to the electric characteristic of NMOS transistor ($M_n$), the discharge current I is zero when the capacitor C is discharged to a zero voltage level at the second terminal. Because the discharge current I is only present during the discharge process, the invention consumes less power than conventional suply voltage level detectors.

Figure 8:
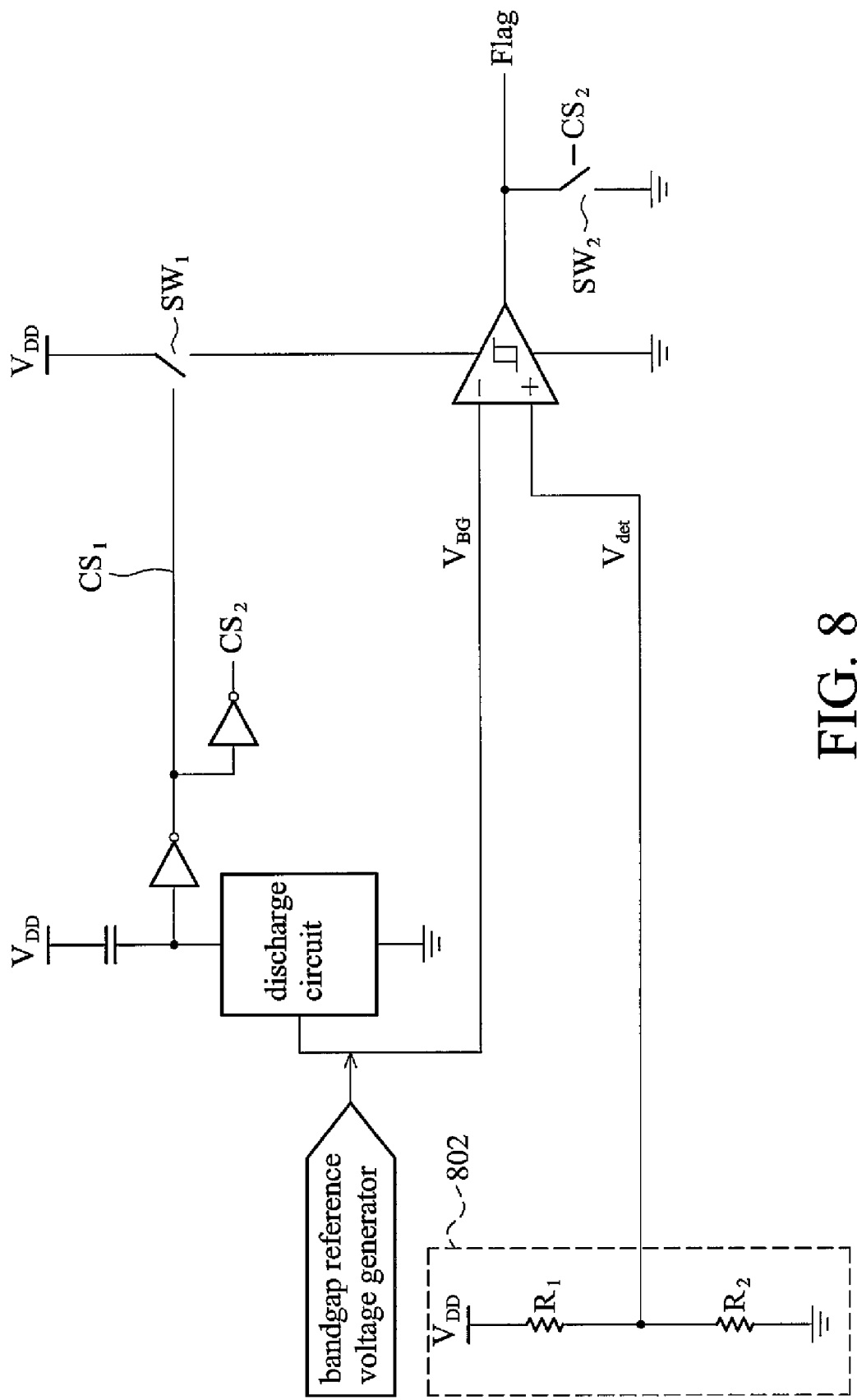
FIG. 8 shows another embodiment of the invention.

FIG. 8 shows another embodiment of the invention, comprising a voltage source divider 802 comprising a plurality of resistors coupled in series between the voltage source $V_{DD}$ and ground, such as $R_1$ and $R_2$ shown in FIG. 8. The voltage source $V_{DD}$ is divided by the serially coupled resistors, thus, the relationship between the detection voltage $V_{det}$ and the voltage source $V_{DD}$ can be easily determined. Compared to the invention, the detection voltage generator 104 of the conventional supply voltage level detector 100 further comprises an unpredictable resistor, the on-resistor of the transistor $M_3$, varying with the manufacturing process of the transistor $M_3$. The unpredictable resistor degrades the precision of the conventional supply voltage level detector 100.

Figure 9:
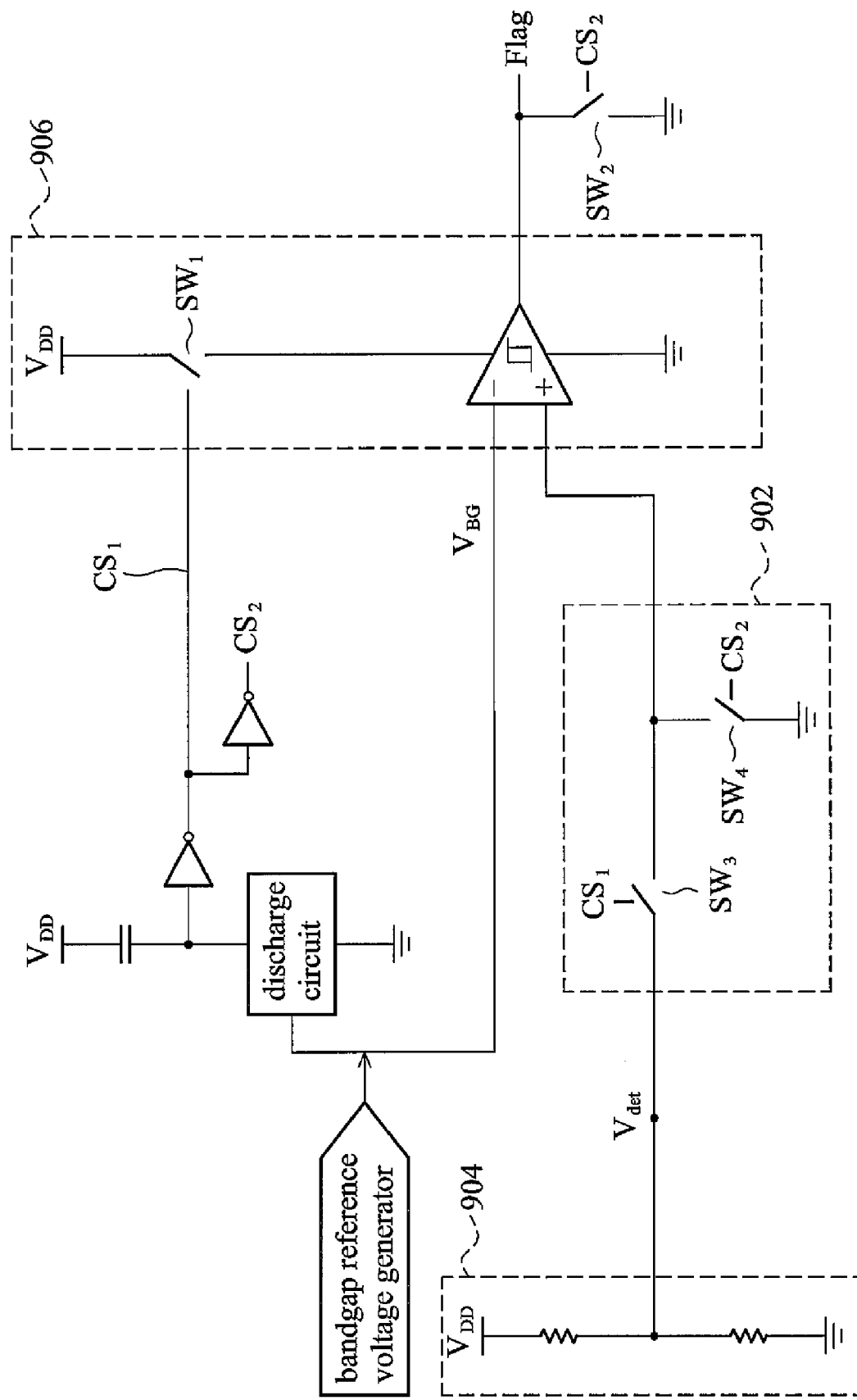
FIG. 9 shows another embodiment of the invention.

FIG. 9 shows another embodiment of the invention, comprising a switching device 902 coupling between the voltage source divider 904 and the comparing device 906. The switching device 902 switches the coupling of comparing device 906 from the detection voltage $V_{det}$ to the ground. The switching device 902 comprises a third switch $SW_3$ and a fourth switch $SW_4$. When the comparing device 906 is enabled, the third switch $SW_3$ is turned on by the first control signal $CS_1$ to couple the detection voltage $V_{det}$ to the comparing device 906, wherein the fourth switch $SW_4$ is disconnected by the second control signal $CS_2$. When the comparing device 906 is disabled, the fourth switch $SW_4$ is turned on by the second control signal $CS_2$ to couple the ground to the comparing device 906, wherein the third switch $SW_3$ is disconnected by the first control signal $CS_1$.

Figure 10:
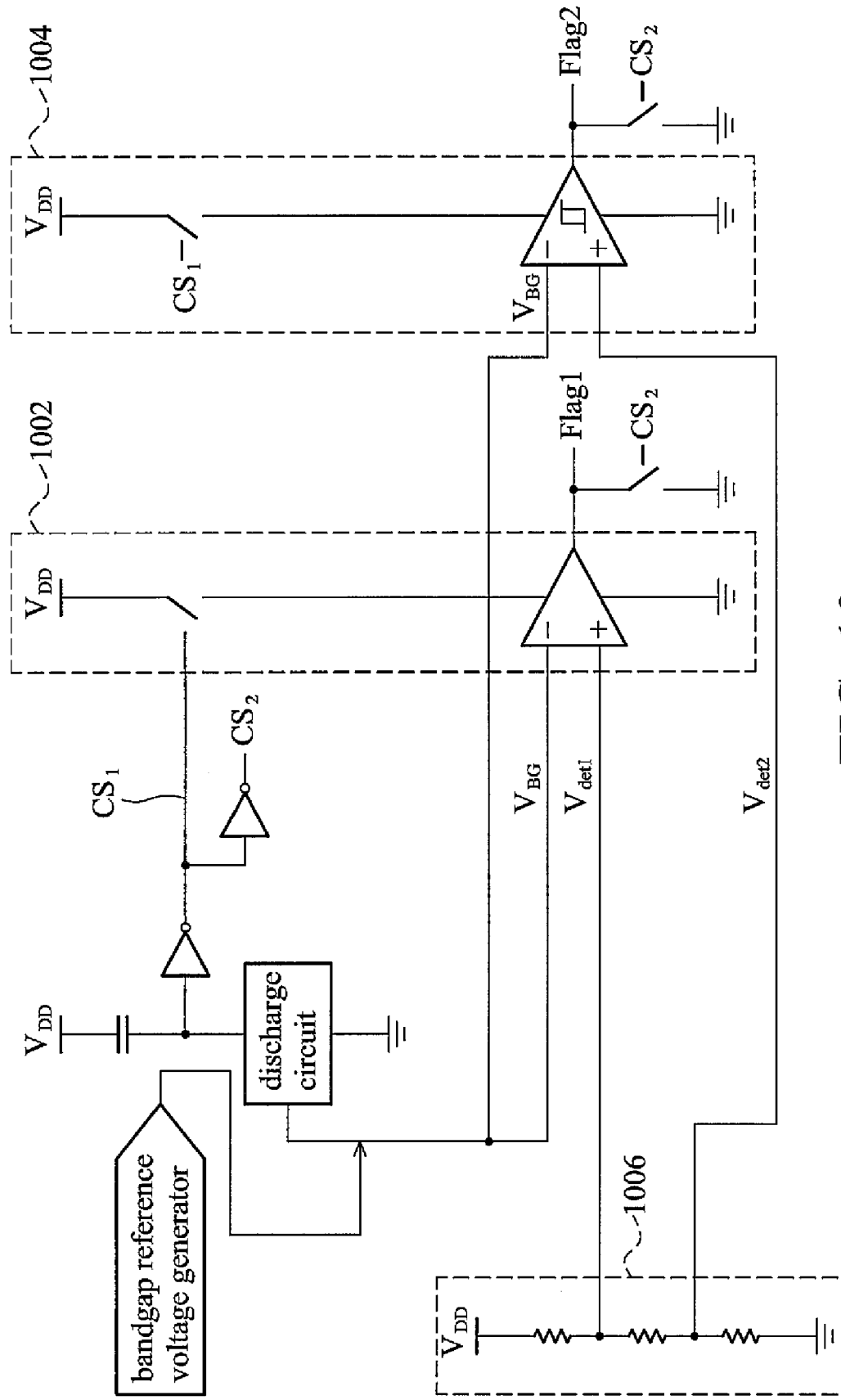
FIG. 10 shows another embodiment of the invention.

FIG. 10 shows another embodiment of the invention, comprising a plurality of comparing devices, such as 1002 and 1004 in the embodiment. The voltage source divider 1006 outputs to detection voltages $V_{det1}$ and $V_{det2}$ for the comparing devices 1002 and 1004, respectively. The structure of the comparing devices 1002 and 1004 are similar to those disclosed in the described embodiments. The voltage range in which the voltage source $V_{DD}$ is located can be determined by the embodiment.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded to the broadest interpretation so as to encompass all such modifications and similar arrangements.

What is claimed is:

1. A supply voltage level detector, comprising:
   a voltage source divider, dividing the voltage level of a voltage source to generate a detection voltage;
   a bandgap reference voltage generator, generating a bandgap reference voltage when the voltage source is reset and returns to a level above a specific voltage level;
   a comparing device, comparing the detection voltage with the bandgap reference voltage to determine the voltage level of the voltage source;
   a control circuit, disabling the comparing device when the bandgap reference voltage is unready, and enabling the comparing device when the bandgap reference voltage is ready; and
   a forcing circuit, coupling to an output terminal of the comparing device and controlled by the control circuit, wherein the forcing circuit forces the voltage level of the output terminal of the comparing device to a specific value indicating the comparing device as invalid when the comparing device is disabled by the control circuit.

2. The supply voltage level detector as claimed in claim 1, wherein the comparing device comprises:
   a comparator; and
   a first switch, coupling between a power terminal of the comparator and the voltage source, and controlled by the control circuit, wherein the first switch is disconnected when the control circuit disables the comparing device, and is turned on when the control circuit enables the comparing device.

3. The supply voltage level detector as claimed in claim 2, wherein the forcing circuit comprises a second switch, coupling between the output terminal of the comparing device with a terminal having a voltage level of the specific value, wherein when the control circuit disables the comparing device, the second switch is connected.

4. The supply voltage level detector as claimed in claim 3, wherein the control circuit comprises:

a capacitor, having a first terminal coupling to the voltage source;
a discharge circuit, coupling to a second terminal of the capacitor, wherein the discharge circuit is turned on to discharge the capacitor by a discharge current when the bandgap reference voltage generator is ready;
a first inverter, having an input terminal coupling to the second terminal of the capacitor, and outputting a first control signal to control the first switch, wherein the first switch is turned on when the first control signal is in a high state, and is turned off when the first control signal is in a low state; and
a second inverter, generating a second control signal by inverting the first control signal, wherein the second switch is controlled by the second control signal, and is turned on when the second control signal is in the high state, and is turned off when the second control signal is in the low state.

5. The supply voltage level detector as claimed in claim 4, wherein the discharge current decreases with the decreasing voltage level of the second terminal of the capacitor.

6. The supply voltage level detector as claimed in claim 4, wherein the discharge circuit comprises a current mirror, comprising:
   a first transistor, having a gate and a drain connected together; and
   a second transistor, having a gate, a source, and a drain coupling to the second terminal of the capacitor, wherein the voltage difference between the gate and source of the second transistor is the same as that of the first transistor, and the gate of the second transistor is coupled to the gate of the first transistor at an output terminal of the bandgap reference voltage generator.

7. The supply voltage level detector as claimed in claim 4, wherein the discharge circuit comprises an n-type metal oxide semiconductor transistor, having a gate coupling to the output terminal of the bandgap reference voltage generator, a drain coupling to the second terminal of the capacitor, and a source coupling to ground.

8. The supply voltage level detector as claimed in claim 1, wherein the voltage source divider comprises a plurality of resistors coupled in series between the voltage source and the ground.

9. The supply voltage level detector as claimed in claim 1 further comprises a switching device, coupling the ground to the comparing device to instead of the detection voltage when the comparing device is disabled by the control circuit.

10. The supply voltage level detector as claimed in claim 9, wherein the switching device comprises:
    a third switch, controlled by the control circuit, wherein the third switch couples the detection voltage to the comparing device when the control circuit enables the comparing device, and is disconnected when the control circuit disables the comparing device; and
    a fourth switch, controlled by the control circuit, wherein the fourth switch couples the ground to the comparing device when the control circuit disables the comparing device, and is disconnected when the control circuit enables the comparing device.

* * * * *